(12) United States Patent
Meadows et al.

(10) Patent No.: US 12,492,846 B2
(45) Date of Patent: Dec. 9, 2025

(54) DUAL MASS COOLING PRECISION SYSTEM

(71) Applicant: STULZ Air Technology Systems, Inc., Frederick, MD (US)

(72) Inventors: David Meadows, Frederick, MD (US); Joerg Desler, Frederick, MD (US)

(73) Assignee: STULZ Air Technology Systems, Inc., Frederick, MD (US)

( * ) Notice: Subject to any disclaimer, the term of this patent is extended or adjusted under 35 U.S.C. 154(b) by 156 days.

(21) Appl. No.: 18/108,691

(22) Filed: Feb. 13, 2023

(65) Prior Publication Data

US 2023/0204257 A1 Jun. 29, 2023

Related U.S. Application Data

(60) Continuation-in-part of application No. 16/841,108, filed on Apr. 6, 2020, now Pat. No. 11,578,897,
(Continued)

(51) Int. Cl.
*F25B 5/02* (2006.01)
*F25B 39/00* (2006.01)
(Continued)

(52) U.S. Cl.
CPC ............... *F25B 5/02* (2013.01); *F25B 39/00* (2013.01); *F25B 41/22* (2021.01); *F25B 43/003* (2013.01); *F25B 45/00* (2013.01); *F25B 49/027* (2013.01); *F28D 1/0443* (2013.01); *F28D 1/0461* (2013.01); *F28D 1/0477* (2013.01); *F28D 7/0066* (2013.01); *F28D 7/106* (2013.01); *H05K 7/20309* (2013.01); *H05K 7/20318* (2013.01); *H05K 7/20327* (2013.01); *H05K 7/20736* (2013.01);

*H05K 7/20818* (2013.01); *F25B 25/005* (2013.01); *F25B 39/028* (2013.01); *F25B 41/34* (2021.01); *F25B 41/385* (2021.01); *F25B 2339/047* (2013.01);
(Continued)

(58) Field of Classification Search
CPC .......... F25B 39/028; F25B 5/02; F25B 39/00; F25B 43/003; F25B 45/00; F25B 39/02; F25B 2400/16; F25B 2500/28; F25B 2600/111; F25B 2600/2513; F25B 2700/2103; F25B 49/027; F25B 2341/0661; F28D 7/0066; F28D 1/0461; F28D 1/0426; F28D 2020/0086; F28D 1/0443; F28D 7/106; F28D 7/10; F28D 1/0477; H05K 7/20818; H05K 7/20309; H05K 7/20263; H05K 7/20609; H05K 7/20318; H05K 7/20327; H05K 7/20736; H05K 7/20718; H05K 7/20672; B60H 1/00328; B60H 1/00342; B60H 1/00278; Y02B 30/70

See application file for complete search history.

(56) References Cited

U.S. PATENT DOCUMENTS

2007/0051119 A1* 3/2007 Hayashi ............... F25B 29/003
62/183

* cited by examiner

*Primary Examiner* — Cassey D Bauer
(74) *Attorney, Agent, or Firm* — Leveque Intellectual Property Law, P.C.

(57) ABSTRACT

Devices, systems, and methods are disclosed for cooling using both air and/or liquid cooling sub circuits. A vapor compression cooling system having both an air and liquid cooling sub circuit designed to service high sensible process heat loads that cannot be solely cooled by either liquid or air is provided.

24 Claims, 14 Drawing Sheets

Related U.S. Application Data which is a division of application No. 15/720,637, filed on Sep. 29, 2017, now Pat. No. 10,653,042, application No. 18/108,691, filed on Feb. 13, 2023 is a continuation-in-part of application No. 16/841,128, filed on Apr. 6, 2020, now Pat. No. 11,499,758, which is a division of application No. 15/720,637, filed on Sep. 29, 2017, now Pat. No. 10,653,042.

(60) Provisional application No. 62/420,827, filed on Nov. 11, 2016.

(51) Int. Cl.
*F25B 39/02* (2006.01)
*F25B 41/22* (2021.01)
*F25B 41/385* (2021.01)
*F25B 43/00* (2006.01)
*F25B 45/00* (2006.01)
*F25B 49/02* (2006.01)
*F28D 1/04* (2006.01)
*F28D 1/047* (2006.01)
*F28D 7/00* (2006.01)
*F28D 7/10* (2006.01)
*H05K 7/20* (2006.01)
*F25B 25/00* (2006.01)
*F25B 41/34* (2021.01)

(52) U.S. Cl.
CPC ..... *F25B 2400/075* (2013.01); *F25B 2400/16* (2013.01); *F25B 2500/28* (2013.01); *F25B 2600/111* (2013.01); *F25B 2600/112* (2013.01); *F25B 2600/2513* (2013.01); *F25B 2600/2515* (2013.01); *F25B 2700/197* (2013.01); *F25B 2700/2103* (2013.01); *F25B 2700/21171* (2013.01); *F25B 2700/21175* (2013.01); *Y02B 30/70* (2013.01)

Header and Distribution
Details Dual Mass Cooling System

Stand off in Coaxial Tube

Stand offs

DUAL MASS COOLING PRECISION SYSTEM

BACKGROUND

A conventional cooling system for a high sensible process heat load removes heat from the working space through convective heat transfer through the air. The air carries the heat from the process heat load to the heat exchanger (evaporator) where heat energy is transferred into a volatile refrigerant that in turn absorbs the heat energy though a two phase process that involves a change from a sub-cooled liquid state to a super-heated vapor state. While in this gaseous state a compressor increases both the temperature and pressure of the gas so as to create the higher temperatures needed to create the differential between the gas temperature and that of the heat removal medium (air, water, glycol, or other) that is required to transfer heat to the ambient environment. Since this heat transfer is dependent on the mass flow rate of the of the heat transfer medium (as well as the specific heat capacity at constant pressure and the temperature differential) a liquid with its higher specific mass may be needed to remove heat in situations where the existing heat flux exceeds the capability of air alone to remove the heat energy. In process cooling spaces where this higher heat flux occurs and 100% liquid cooling is not practical, a device and/or system that can simultaneously provide both cooling fluids, air and water, is needed.

There accordingly remains a need for devices, systems, and methods that provide improved cooling other than solely liquid cooling.

BRIEF DESCRIPTION OF THE DRAWINGS

The accompanying drawings provide visual representations which will be used to more fully describe various representative embodiments and can be used by those skilled in the art to better understand the representative embodiments disclosed and their inherent advantages. The drawings are not necessarily to scale, emphasis instead being placed upon illustrating the principles of the devices, systems, and methods described herein. In these drawings, like reference numerals may identify corresponding elements.

DETAILED DESCRIPTION

Figure 1:
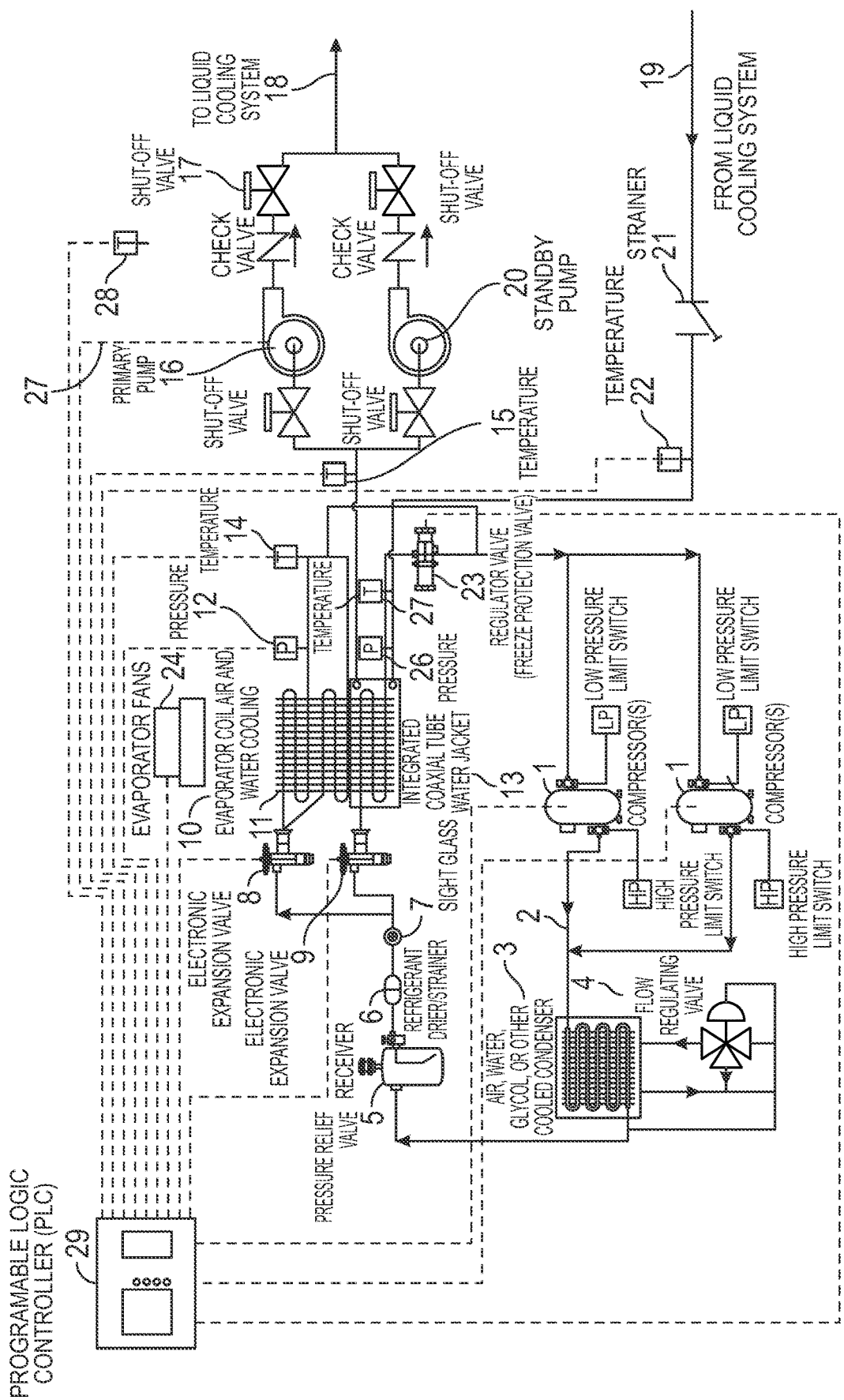
FIG. 1 illustrates a block diagram of a vapor compression cooling system having both air and liquid cooling sub circuits, in accordance with representative embodiments.

The various methods, systems, apparatus, and devices described herein generally provide for the cooling of loads using a combination of air and liquid cooling sub circuits. A vapor compression cooling system having both an air and liquid cooling sub circuit designed to service high sensible process heat loads that cannot be solely cooled by either liquid or air. This requirement is driven by the increased watt densities experienced in many process cooling environments that exceed the ability of air to remove all the heat but do require some air to augment the liquid cooling capabilities due to space geometry and/or the inability to get fluid to all components that need to be cooled. The system is distinguished by a combination air and liquid cooling evaporator, also referred to as a dual air and liquid evaporator.

While this invention is susceptible of embodiment in many different forms, there is shown in the drawings and will herein be described in detail specific embodiments, with the understanding that the present disclosure is to be considered as an example of the principles of the invention and not intended to limit the invention to the specific embodiments shown and described. In the description below, like reference numerals may be used to describe the same, similar or corresponding parts in the several views of the drawings.

In this document, relational terms such as first and second, top and bottom, and the like may be used solely to distinguish one entity or action from another entity or action without necessarily requiring or implying any actual such relationship or order between such entities or actions. The terms "comprises," "comprising," "includes," "including," "has," "having," or any other variations thereof, are intended to cover a non-exclusive inclusion, such that a process, method, article, or apparatus that comprises a list of elements does not include only those elements but may include other elements not expressly listed or inherent to such process, method, article, or apparatus. An element preceded by "comprises . . . a" does not, without more constraints, preclude the existence of additional identical elements in the process, method, article, or apparatus that comprises the element.

Reference throughout this document to "one embodiment," "certain embodiments," "an embodiment," "implementation(s)," "aspect(s)," or similar terms means that a particular feature, structure, or characteristic described in connection with the embodiment is included in at least one embodiment of the present invention. Thus, the appearances of such phrases or in various places throughout this specification are not necessarily all referring to the same embodiment. Furthermore, the particular features, structures, or characteristics may be combined in any suitable manner in one or more embodiments without limitation.

The term "or" as used herein is to be interpreted as an inclusive or meaning any one or any combination. Therefore, "A, B or C" means "any of the following: A; B; C; A and B; A and C; B and C; A, B and C." An exception to this definition will occur only when a combination of elements, functions, steps or acts are in some way inherently mutually exclusive. Also, grammatical conjunctions are intended to express any and all disjunctive and conjunctive combinations of conjoined clauses, sentences, words, and the like, unless otherwise stated or clear from the context. Thus, the term "or" should generally be understood to mean "and/or" and so forth.

All documents mentioned herein are hereby incorporated by reference in their entirety. References to items in the singular should be understood to include items in the plural, and vice versa, unless explicitly stated otherwise or clear from the text.

Recitation of ranges of values herein are not intended to be limiting, referring instead individually to any and all values falling within the range, unless otherwise indicated, and each separate value within such a range is incorporated into the specification as if it were individually recited herein. The words "about," "approximately," "substantially," or the like, when accompanying a numerical value, are to be construed as indicating a deviation as would be appreciated by one of ordinary skill in the art to operate satisfactorily for an intended purpose. Ranges of values and/or numeric values are provided herein as examples only, and do not constitute a limitation on the scope of the described embodiments. The use of any and all examples, or exemplary language ("e.g.," "such as," or the like) provided herein, is intended merely to better illuminate the embodiments and does not pose a limitation on the scope of the embodiments. No language in the specification should be construed as indicating any unclaimed element as essential to the practice of the embodiments.

For simplicity and clarity of illustration, reference numerals may be repeated among the figures to indicate corresponding or analogous elements. Numerous details are set forth to provide an understanding of the embodiments described herein. The embodiments may be practiced without these details. In other instances, well-known methods, procedures, and components have not been described in detail to avoid obscuring the embodiments described. The description is not to be considered as limited to the scope of the embodiments described herein.

In the following description, it is understood that terms such as "first," "second," "top," "bottom," "up," "down," "above," "below," and the like, are words of convenience and are not to be construed as limiting terms. Also, the terms apparatus and device may be used interchangeably in this text.

In general, the devices, systems, and methods described herein may provide vapor compression to simultaneously provide air and liquid cooling specifically for high sensible process cooling loads.

Although the devices, systems, and methods described herein may emphasize the simultaneous use of air and liquid cooling, and in particular water cooling, the use of other types of liquid cooling may also or instead be made possible through the devices, systems, and methods described herein including the use of water, glycol, and the like.

Therefore, in accordance with the various embodiments described herein, the disclosure provides a vapor compression system capable of simultaneously providing air and liquid cooling for high sensible process cooling loads. The disclosure in certain embodiments provides a combination water cooler (chiller), air cooler (evaporator), compressor(s), parallel electronic metering devices, liquid pumps, condenser(s), and controls. The system cools those portions of the heat load that cannot be reached by the liquid cooling while simultaneously providing chilled water for liquid cooling process (direct to chip, emersion bath, etc.). It is important to note that the air and water cooling evaporator is an integrated unit that is serviced by a single refrigerant flow path and is housed in a common casing, in accordance with certain disclosed embodiments.

Description of Device and System Operation

In accordance with embodiments described herein, a vapor compression system, and, more particularly one vapor compression system, is operable to simultaneously provide air and liquid cooling for high sensible process cooling loads. The vapor compression system has a combination water cooler (chiller), air cooler (evaporator), compressor(s), parallel electronic metering devices, liquid pumps, condenser(s), and controls. The system cools those portions of the heat load that cannot be reached by the liquid cooling while simultaneously providing chilled water for liquid cooling process (direct to chip, emersion bath, etc.). The air and water cooling evaporator may be an integrated unit that is serviced by a single refrigerant flow path and is housed in a common casing in accordance with certain embodiments.

The dual air and liquid evaporator is operable to simultaneously provide process cooling liquid, such as water, a glycol mixture, a solution or other fluid, and cooled air to equipment such as liquid cooled computer servers, magnetic resonance imaging machines, industrial machines, and other devices that require both air and water cooling. The term water is used herein but the fluid could be a solution, as well as a glycol mixture, and the terms water and liquid may be used interchangeably. A unique characteristic in accordance with the various embodiments presented herein is the combined air and water evaporator, which may also be referred to as a dual air and water evaporator, dual air and water evaporator coil, dual evaporator, evaporator coil, or the like, that may be comprised of copper tubing with aluminum or copper fins, as well as the control algorithms employed by a controller that simultaneously control the cooling of water and air.

Figure 4:
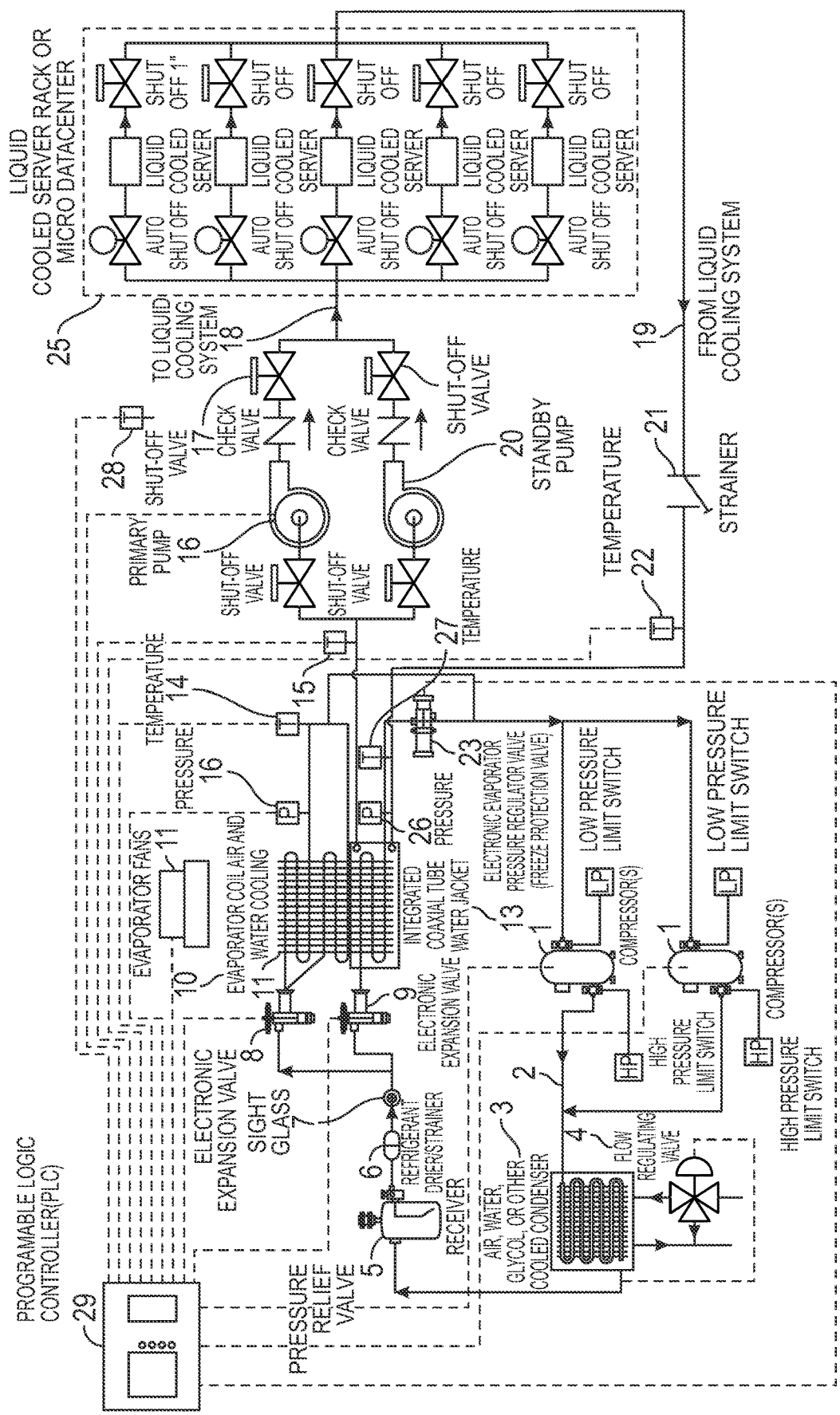
FIG. 4 illustrates a block diagram of a vapor compression cooling system having both air and liquid cooling sub circuits, and showing use of the same to provide cooled liquid and air to servers, in accordance with representative embodiments

As described herein and as illustrated by the system block diagrams of FIGS. 1 and 4, the system may have the following elements, in which the reference numbers correspond to those shown in the drawing:

1. Compressor or compressors, either fixed speed, digital, or variable, single or tandem, scroll or reciprocating
2. Refrigerant
3. Condenser (may be air, water, glycol or other medium cooled with appropriate head pressure controls)
4. Flow regulating valve
5. Refrigerant receiver
6. Refrigerant drier/strainer
7. Sight glass
8. Electronic expansion valve
9. Electronic expansion valve
10. Dual air and water cooling evaporator/evaporator coil
11. Air cooling section of dual evaporator
12. Pressure transducer/sensor 13. Liquid cooling section of dual evaporator
14. Temperature sensor
15. Temperature sensor, supply line
16. Primary pump
17. Shut-off valves
18. To liquid cooling device(s)/system(s)
19. From liquid cooling device(s)/system(s)
20. Standby pump
21. Strainer
22. Temperature sensor
23. Electronic evaporator pressure regulator valve (EEPR)/freeze protection value
24. Evaporator fan(s)
25. Liquid cooled server rack/micro data center
26. Pressure transducer/sensor
27. Temperature sensor
28. Remote air temperature sensor
29. Programmable logic controller (PLC) with special control algorithms
30. Coaxial cable
31. Outer tube
32. Inner tube As illustrated by the system block diagram of FIG. 1, during operation of this system return air and supply water temperatures are measured and these values are communicated to the PLC 29. When the temperatures of either of these values is above the individual set point the compressor will turn on to provide refrigerant flow to the air cooling evaporator coil, the liquid cooling chiller evaporator, or both. In systems comprising two or more compressors the additional compressors will turn on at set point temperature plus a programmable differential temperature. Refrigerant flows to the electronic expansion valve(s) 8, 9 which will be positioned to regulate refrigerant flow 2 and superheat values as needed to maintain air and water temperature set points. The electronic EPR valve 23, also referred to as a freeze protection valve, will be positioned by the PLC 29 such that the temperature of the refrigerant flowing through the liquid cooling section of the evaporator coil is always held above the freezing temperature of that liquid (programmable feature).

Figure 3:
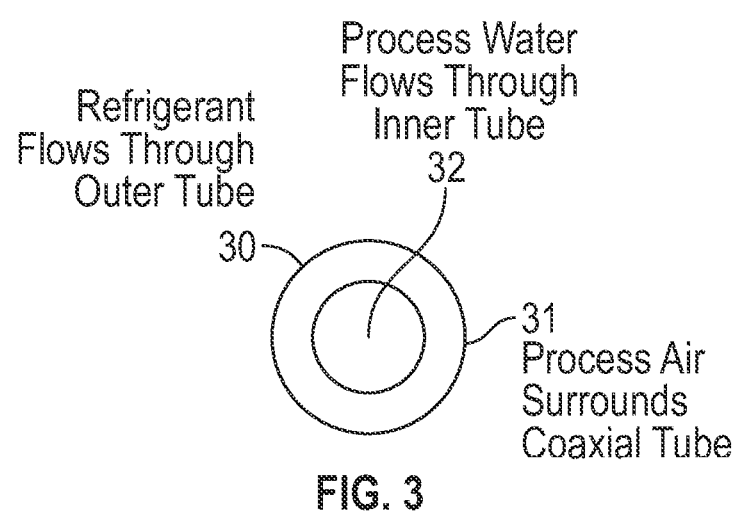
FIG. 3 illustrates an example coaxial tube, in accordance with various embodiments.

A distinguishing feature of the water cooling evaporator section is the use of coaxial tubes. As illustrated in FIG. 3, the innermost tube 32 of coaxial tube 30 houses the flow of the process cooling liquid, such as water, the outer tube 31 houses the refrigerant flow and the entire assembly is in the process cooling airstream. Heat energy is simultaneously transferred from both the air and the water into the refrigerant. The hot return process water may be insulted from the cooling air by the refrigerant "jacket" surrounding evaporator coil 10, as shown. The liquid cooling section 13 has a dedicated electronic expansion valve that modulates flow to maintain the superheat at the set point.

Air cooled by the air cooling section 11, also referred to as an air evaporator coil, is distributed to the space to be cooled by a number of electronically commutated backward inclined centrifugal fans, as an example. The rotational speed of the fans, and therefore the volumetric flow rate of the air, may be a programmable feature. The liquid cooled in the liquid cooling section of the evaporator, also referred to as a liquid cooling section, is distributed to a secondary liquid cooling system via a centrifugal pump(s), for example.

The condenser section 3 may be one of two basic models:
1) Air cooled condenser with head pressure controlled by one of the following:
   a. Variable fan speed control
   b. Flooded head pressure control
   c. Combination of both a. and b.
2) Liquid cooled condenser
   a. Plate fin heat exchanger with head pressure control valve
   b. Coaxial heat exchange with head pressure control valve The PLC 29 will provide all controls, safeties, alarms, and trending functions of the system.

Figure 2:
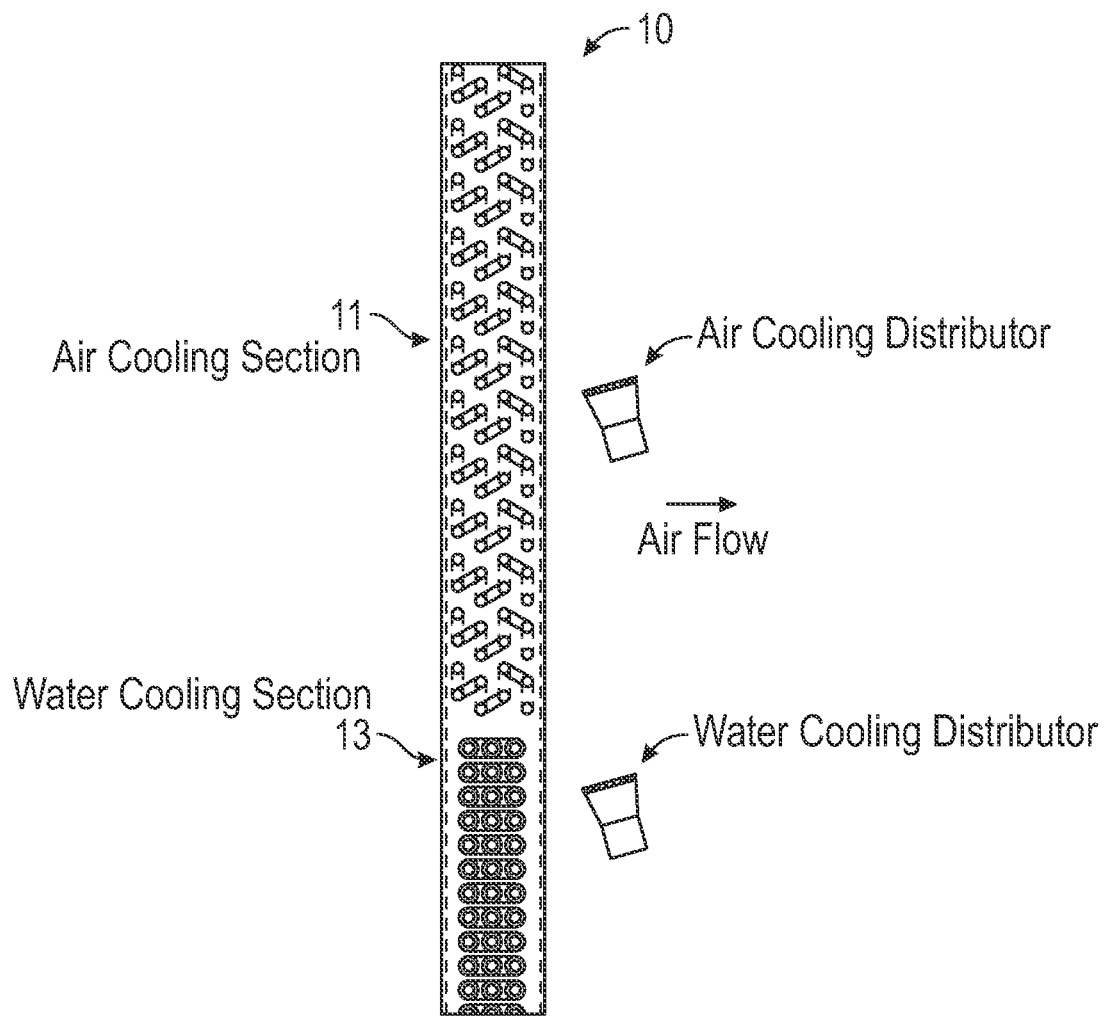
FIG. 2 illustrates a diagram with detail of a combined air and water cooling evaporator, in accordance with representative embodiments.
Figure 5:
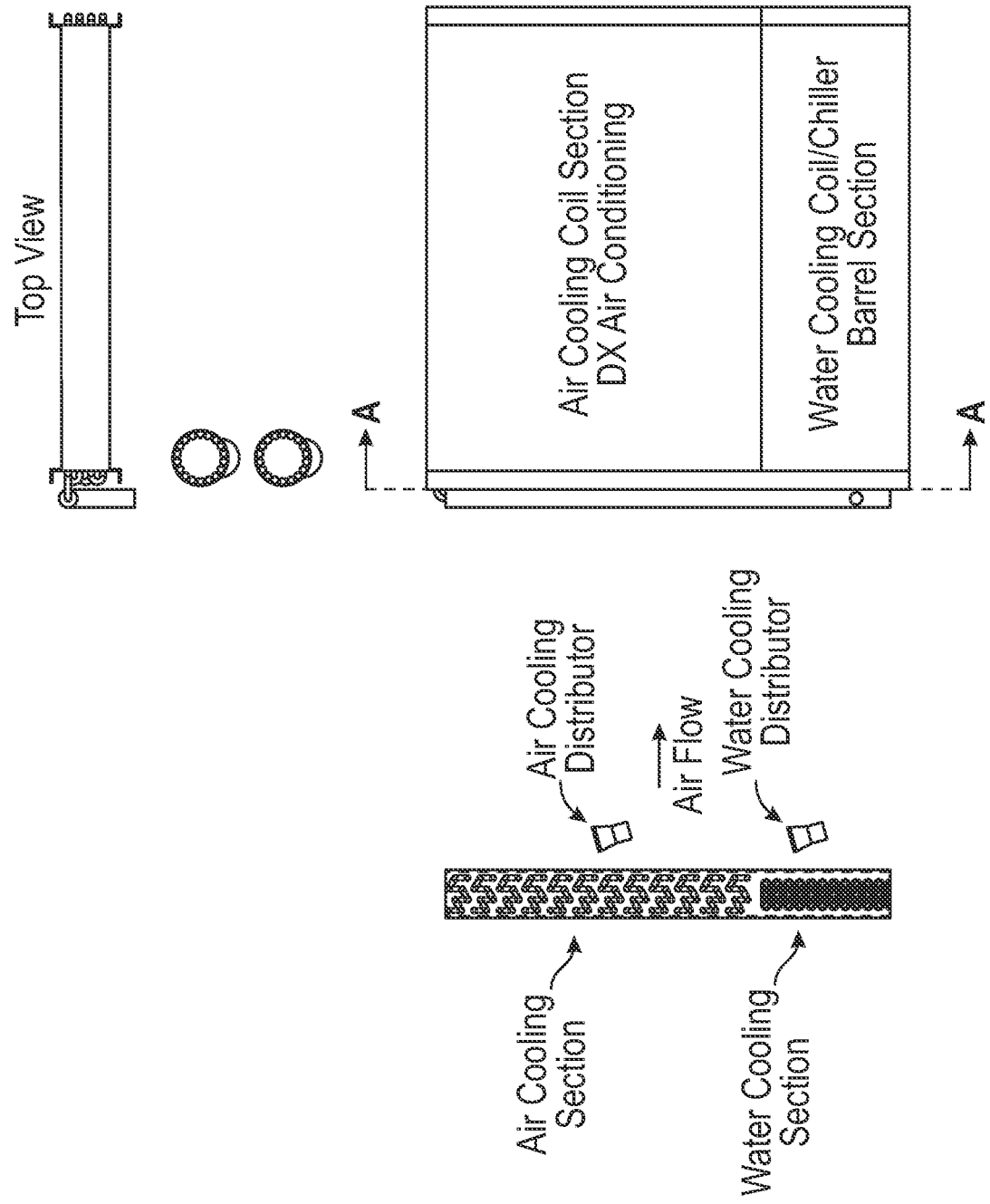
FIG. 5 illustrates example construction of the dual air and liquid evaporator, in accordance with various embodiments.

FIG. 2 illustrates a combined air and water cooling evaporator coil 10, in accordance with certain embodiments of the present invention. There are one or more air cooling distributors and one or more water cooling distributors as shown. Further to FIG. 2, FIG. 5 illustrates example construction of the dual air and liquid evaporator, in accordance with various embodiments. In this particular embodiment, it can be seen in the front view that the air cooling section 11 can be housed in an air cooling coil section of a direct expansion (DX) air conditioning unit while the liquid/water cooling section 13 is disposed in the barrel section of a water cooling coil/chilller.

As shown in FIG. 3, refrigerant flows through the outer tube 32, while process water flows through the inner tube 34 of a coaxial tube, for example. Process air surrounds the coaxial tube. The combined air and water cooling evaporator coil has an air cooling section and a water cooling section, as shown in FIG. 3.

The dual evaporators are housed in a common frame that contains the air cooling section 11 of the evaporator coil and the water cooling section 13 of the evaporator coil. Details of the evaporator design are shown in FIG. 2 and FIG. 3. Both sections of the evaporator coil are fed a volatile refrigerant that changes phase in the evaporator to remove heat energy from the air section (11) and the air and the water in the water cooling section 13. In the water cooling section 13 of the evaporator the refrigerant flows around the inner tube 32 of the coaxial tube 30 while the process liquid, which may be process water, a glycol mixture, or solution, flows through the inside tube, as shown in FIG. 3. The coaxial tube 30 is surrounded by air flow that is generated by the evaporator fan 24. Because the refrigerant absorbs heat energy and becomes a saturated vapor in the evaporator coil, its pressure, and therefore its temperature, may be controlled by use of an electronic expansion valve (EEV), one EEV 8 is dedicated to the air cooling section and one EEV 9 is dedicated to the liquid cooling section. The refrigerant temperature in the water cooling section 13 is maintained below the surrounding air temperature and the process water temperature to insure heat energy flows into the refrigerant from both the water flowing in the tubes and the air flowing over the evaporator coil. In the air cooled section 11 of the evaporator coil the refrigerant flow is controlled by the EEV dedicated to that section 8 to control supply air temperature which is monitored by remote temperature sensor 28; likewise, in the water cooled section EEV 9 controls the leaving (supply) water temperature. The EEVs are controlled by a system controller, such as a programmable logic controller (PLC), like PLC 29, microprocessor, or the like, that receives control inputs from refrigerant pressure transducers 12, 26 and refrigerant temperature sensors 14, 27. Sensors 12, 14 provide inputs to the PLC to control the EEV 8 for the air cooling section and sensors 26, 27 provide inputs to the PLC to control the EEV 9 for the water cooling section.

These control inputs to a PLC generate a control response to maintain some user selectable amount of superheat in the refrigerant to prevent liquid "slugging" of the compressor(s) 1.

The compressor(s) 1 provide the mass flow rate of refrigerant through the apparatus. The compressors could be one or more of the following types: scroll, reciprocating, semi hermetic, screw, tandem, digital, electronically commutated, of variable frequency speed controlled. The compressor(s) 1 are controlled by the PLC 29 to ensure sufficient cooling of the air and water.

The condenser 3 may be an air, water, or glycol cooled condenser, such as that illustrated in FIG. 1. The condenser transfers the heat energy absorbed into the refrigerants to the cooling medium (air, water, or glycol) so that that heat energy can be transferred to the environment. Condensing temperature is controlled by a head pressure control valve 4 for a water or glycol cooled condenser and is controlled by fan speed or fan cycling for air cooled condensers. A refrigerant receiver 5 is located downstream from the condenser 3, the receiver 5 stores excess refrigerant, allows for expansion and contraction of the refrigerant during transient conditions and insures that the EEVs 8, 9 have 100%, or close to 100%, liquid refrigerant fed to them. This is important for proper EEV operation. Also, refrigerant receiver 5 may have a pressure relief valve as shown. Prior to the refrigerant flowing to the EEVs it passes through refrigerant drier strainer 6 to remove water from the refrigerant and strain out any contaminates such as brazing debris. A refrigerants site glass 7 aids in refrigerant charging and indicates the presence of water in the refrigerant.

After the refrigerant flows through the air and water cooling sections of the evaporator it flows through the electronic evaporator pressure regulator (EEPR) valve 23. The EEPR valve is controlled by the PLC 29 to provide two distinct functions:
  Provide freeze protection of the liquid/water cooling section 13 of the evaporator coil 10. This is needed to ensure that the coaxial tubes 30 are not damaged by water freezing in the center of the tube. This is accomplished by monitoring supply water temperature provided by the temperature sensor 15 as well as a refrigerant saturation temperature and pressure provided to the PLC 29 by pressure sensor 26 and temperature sensor 27. By maintaining the refrigerant pressure above the freezing point of the water or other liquid, the liquid/water cooling section will be protected against freezing damage.
  Stabilize common compressor suction line pressures. The refrigerant flowing through the two sections of the evaporator will at times be at very different portions of the refrigerant saturation curve. The common suction line serves as a direct contact heat exchanger where the two parallel refrigerant streams mix. The PLC 29 monitors the temperature sensor 14 and pressure sensor 12 and provides a control signal to constantly adjust the EEPR valve position to maintain refrigerant conditions within acceptable range. This adjustment may be performed constantly, close to real time, or it may be performed periodically.

The water or liquid supply system feeds water cooled equipment where that heat energy is absorbed by the liquid and returned to the liquid cooled section 13 of the evaporator coil 10 where that heat is transferred into the refrigerant. Liquid flow through the apparatus is provided by the use of pumps 16, 20. The pumps can be of the centrifugal or the positive displacement variety. They could be constant speed or speed controlled pumps. They may be single pumps (16) or multiple pumps 16, 20 provided for redundancy. The pumps are typically provided with check valves to prevent backflow through an idle pump and isolation or shut-off valves 17 to facilitate repair and maintenance. A strainer 21 is supplied to remove any particles that may be in the liquid/water line due to construction or the formation of corrosion products. The supply and return lines have temperatures sensors 15, 22, respectively, that provide temperature information to the PLC 29 to control pumps 16, 20, compressors 1, and EEVs 8, 9, etc.

Figure 6:
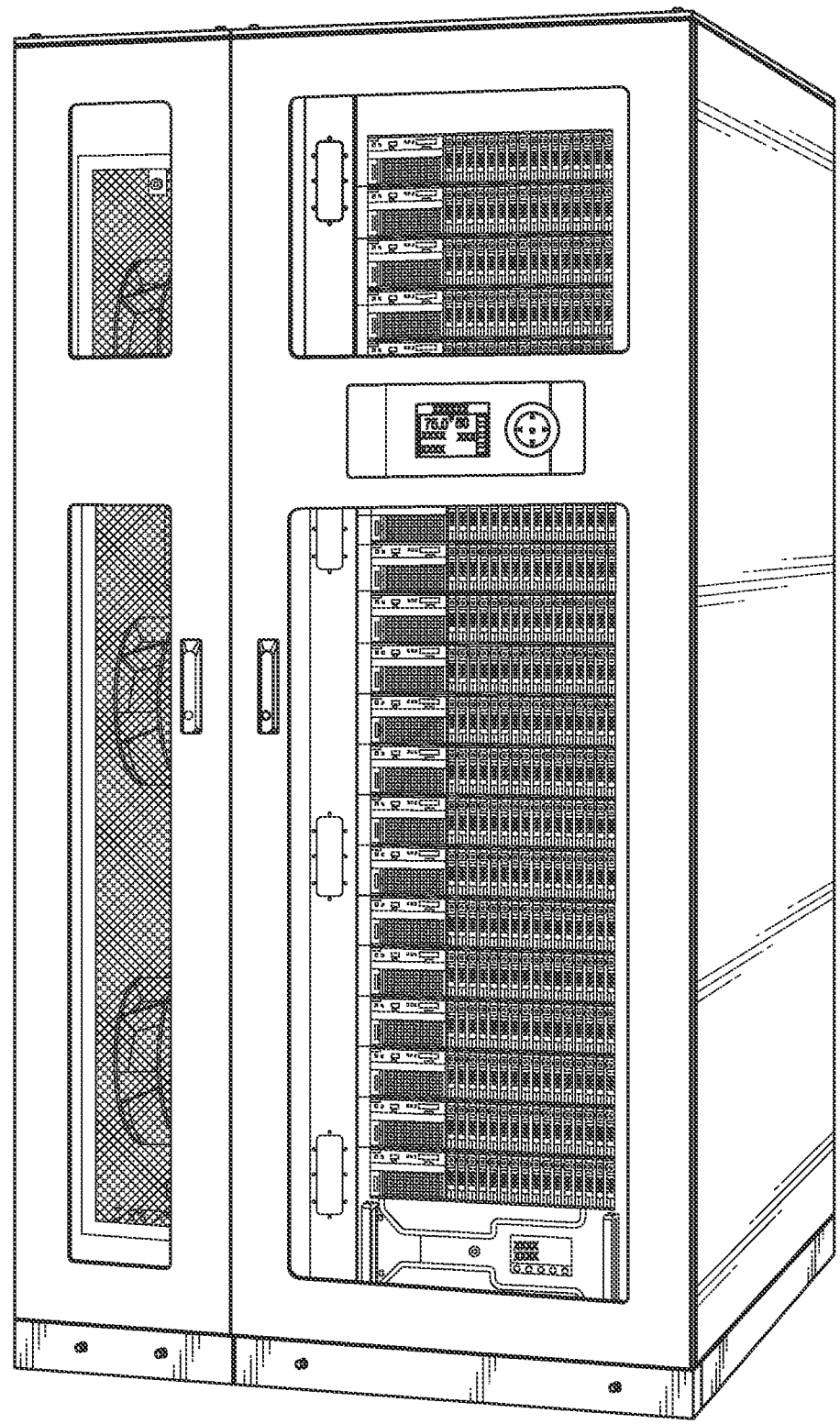
FIGS. 6 and 7 illustrate examples in which the dual air and liquid evaporator is housed in a micro data center, in accordance with representative embodiments.
Figure 7:
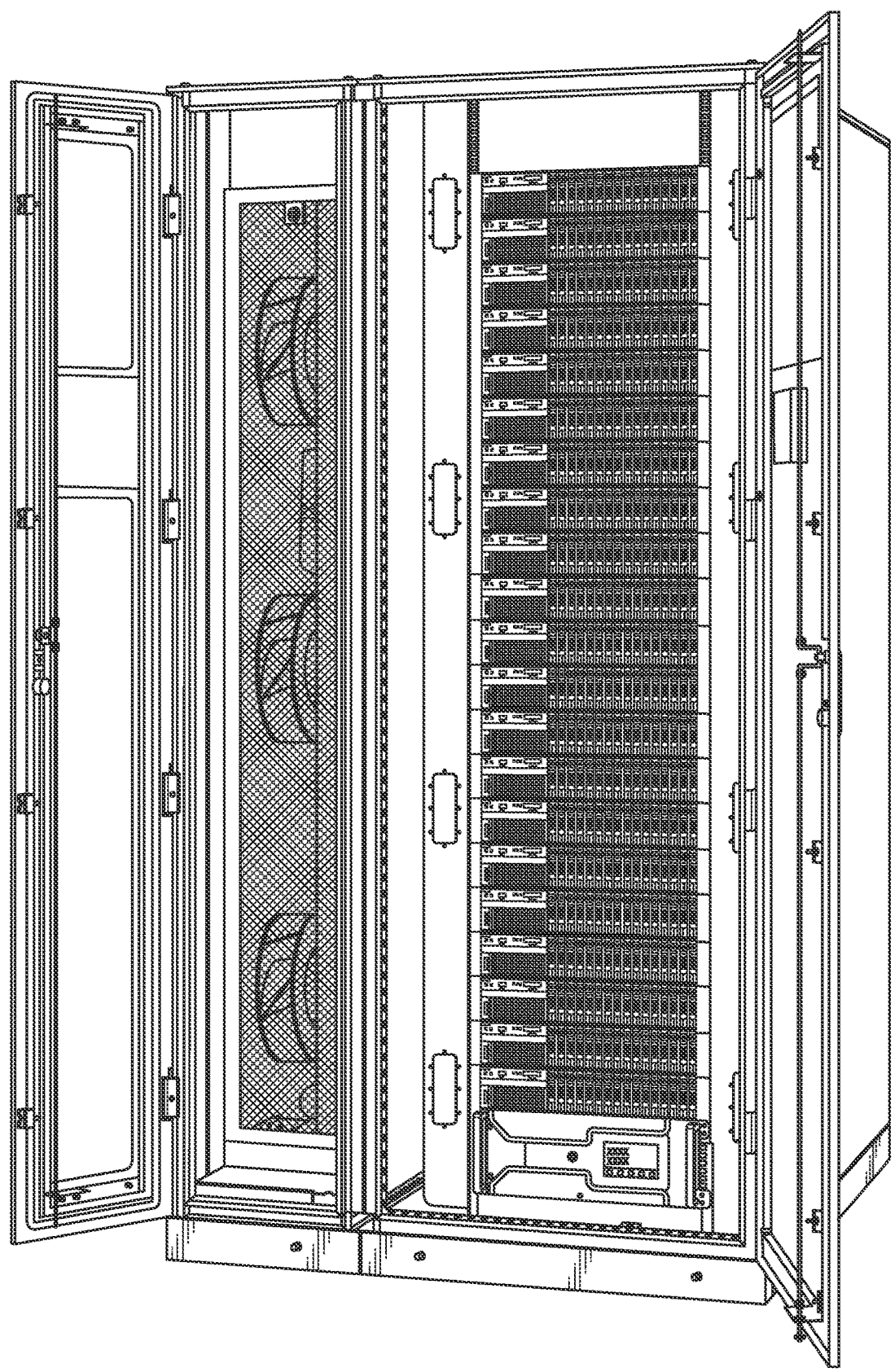

The dual air and liquid evaporator is particularly advantageous in heat removal of liquid cooled servers, such as may be used in liquid cooled server racks and/or micro data centers 25, as illustrated in FIG. 4. In the drawing, within the dashed box, a number of micro cooled servers in line with auto shut off valves are shown. Further to FIG. 4, FIGS. 6 and 7 illustrate an example rendering in which the dual air and liquid evaporator is housed in a micro data center. These drawings show the cabinet doors of a micro data center in both closed and open configurations.

In accordance with the various embodiments presented herein, the dual air and liquid evaporator may be advantageously used to cool such configurations having cool liquid cooled servers. Servers can be liquid cooled to support much higher watt densities then can be cooled with air alone. Liquid cooling also requires just a fraction of the power that traditional server air cooling requires. The vast majority of the heat load within a contemporary server is generated by the central processing unit, graphic processing unit, random access memory dual inline memory modules (RAM DIMM), and voltage regulators. These components alone can represent between 70% and 80% of the heat generated by the computer server. Small liquid cooled heat exchangers, including, for example, water cooled heat exchangers and water cooled jackets, can be attached directly to these server components and the liquid cooled by the dual air and liquid evaporator can be used to remove this heat energy so that it can be rejected to the outside through the dual air and liquid evaporator's condenser, as previously explained. The liquid is fed back to the dual air and liquid evaporator to be re-cooled in the liquid cooling section of the dual air and liquid evaporator to repeat the cycle.

Even though the vast majority of the heat energy can be removed by the cooling liquid provided by the liquid cooling section, there are still components on the server mother board, notably, that produce heat but are too small to have individual liquid/water cooled heat exchangers or liquid/water cooled jackets attached directly to them. Nonetheless, these components, such as resistors, capacitors, wires, and solder traces need to have the heat they produce removed by the use of air cooling. The air that is cooled in the air cooling section of the dual air and liquid evaporator is directed by cabinetry or ducting to supply this cooling air to the servers. The air, once heated by the servers, is returned to the dual air and liquid evaporator by ducting or cabinetry to be re-cooled and the cooling system is started again. The air cooling section of the dual air and liquid evaporator may additionally serve as a dehumidifier to remove excess moisture from the air circulated through the computer server. Excess moisture in the air can lead to advanced corrosion that can potentially destroy the server. The cold refrigerant tubes in the air cooling section of the dual air and liquid evaporator will strip the excessive moisture by absorbing the latent heat of vaporization from the liquid/water vapor in the air. This condensed liquid may flow downward into a drain pan under the evaporator coil, for example, where it can be removed via gravity or a condensate pump.

System Controls

The dual air and liquid evaporator or evaporator system is equipped with a programmable logic controller (PLC) 29 with software designed to operate components such as the compressor(s), speed drives, fans, EEVs, EEPRs, and pumps discussed above.

Although it ultimately controls supply liquid/water temperature and supply air temperatures, the PLC 29 may also monitor and control all internal and external control functions in accordance with certain embodiments. The parameters of the system and dual air and liquid evaporator that are controlled and/or monitored by the PLC may include temperature and humidity set points, multiple stages of cooling and dehumidification, input power, delays, run time history, and alarm status.

The display of the PLC indicates the actual temperature, relative humidity, dew point, and all current active functions such as heat, cool, dehumidification and humidification, set points, alarms, and parameter modifications using a series of menus.

Cooling Controls

The PLC 29 cycles compressor(s) 1 on and off for capacity control when the controller determines that each stage of cooling is called for. If the compressors are variable speed models then the PLC adjusts compressor rotation speed to match the required air and liquid/water cooling mode. The stages of cooling are turned on based upon the controller's cooling response to temperature and humidity inputs from the air and liquid sensors. Each cooling stage will turn on, following a time delay, once the programmed "Cooling Stage Enable" set point value for that stage has been reached. The compressor(s) are turned off when the controller set points for each stage is satisfied.

The PLC is equipped with analog input positions for monitoring temperature and humidity sensor(s) for automatic operation of the air conditioner. Sensor(s) may be duct or cabinet mounted to monitor return air and supply liquid conditions and/or located to monitor the supply or room/ cabinet/server air conditions for the controller to determine the demand for cooling and dehumidifying against the control set points. The controller determines the appropriate response output signal(s) in direct proportion to the return air sensor input signal(s) to operate the A/C system modes.

Control of the Evaporator Fan

The PLC is configured to control the evaporator fan 24 speed from 100% to a minimum setting of the total system airflow volume, for example. Minimum, maximum, and dehumidification fan speed settings may be user adjustable locally at the PLC terminal. If the evaporator fan motor is a constant speed device than in certain embodiments the fan will run at 100% fan speed at all times. If it is a variable speed motor the fan may decrease its rotational speed during periods of low air cooling load and/or dehumidification load.

Dehumidifying Controls

When dehumidification is called for the controller will operate the compressor(s) 1 at full output to strip moisture from the air. The system remains in the cooling mode until the actual relative humidity (or dew point) reaches the humidity (or dew point) set point plus the dehumidification cut-off offset or until the dehumidification minimum temperature is reached.

The controller, PLC or otherwise, may be configured for temperature and relative humidity or dew point control for dehumidification and humidification functions. When enabled for traditional relative humidity control, the controller may continuously monitor the selected humidity control sensors (outdoor air or return air) to determine when to activate the humidification or dehumidification modes.

When enabled for dew point control, the controller logically examines the coupling of temperature and relative humidity (dew point) and determines the proper control of cooling and dehumidification to move the actual conditions to within the boundaries of the temperature/humidity set points as they would appear on a psychrometric chart (see below). It may avoid scenarios where the A/C unit might both cool and humidify the supply air when cooling alone will achieve the desired result.

Summary of Methodologies Described Herein

Figure 8:
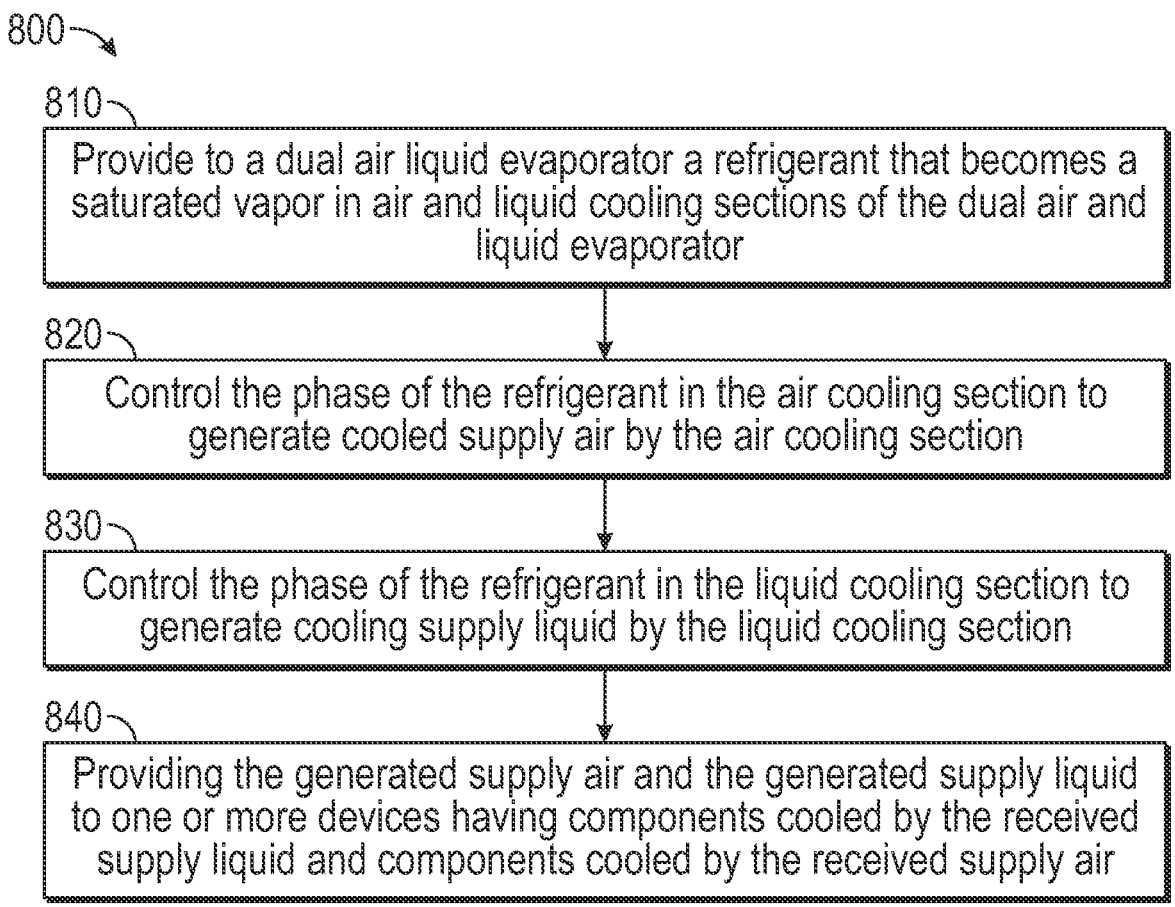
FIG. 8 illustrates a methodology for simultaneously providing air and fluid cooling by a dual air and liquid evaporator, in accordance with various embodiments.

Referring now to FIG. 8, a flow 800 illustrates a methodology for simultaneously providing air and fluid cooling by a dual air and liquid evaporator. In block 810, a refrigerant is provided to a dual air and liquid evaporator that becomes a saturated vapor in air and liquid cooling sections of the dual air and liquid evaporator. Refrigerant may be provided simultaneously to the air and liquid cooling sections. The phase of the refrigerant in the air cooling section is controlled to generate cooled supply air by the air cooling section in block 820, while the phase of the refrigerant is controlled in the liquid cooling section to generate cooling supply liquid by the liquid cooling section at block 830. The generated supply air and the generated supply liquid can then be provided to one or more devices having components cooled by the received supply liquid and components cooled by the received supply air at block 840.

Further method actions that may be taken in accordance with various embodiments, described at length above, include:

transferring heat energy absorbed by the refrigerant in the air and/or liquid cooling sections to the environment outside the dual air and liquid evaporator.

controlling the temperature of the refrigerant in the air cooling section to control the temperature of the generated supply air and controlling the temperature of the refrigerant in the liquid cooling section to control the temperature of the generated cooling supply liquid.

maintaining the temperature of the refrigerant in the liquid cooling section below the temperature of air surrounding the liquid cooling section and below the temperature of process liquid flowing in the liquid cooling section. This may be performed by a control element, such as valve 9 used to control liquid cooling section 13.

controlling a first control element that controls the temperature of the refrigerant in the air cooling section responsive to pressure or temperature measurements of the refrigerant in the air cooling section, and controlling a second control element that controls the temperature of the refrigerant in the liquid cooling section responsive to pressure or temperature measurements of the refrigerant in the liquid cooling section. As described PLC 29 may control 8 to control the temperature of the refrigerant in air cooling section 11 responsive to measurements taken by sensors 12, 14, while PLC 29 may control 9 to control the temperature of the refrigerant in liquid cooling section 13 response to measurements taken by sensors 26, 27. Further the heat level of the refrigerant can be maintained responsive to temperature and/or pressure measurements of the refrigerant in the air and/or liquid cooling sections; compressors 1, which controls the mass flow rate of the refrigerant, can be controlled by PLC 29 responsive to such measurements. The level of heat of the refrigerant may be selected by a user or programmed, for example.

removing water and/or contaminants from the refrigerant before providing refrigerant to the dual air and liquid evaporator.

sensing the temperature of the generated supply liquid; measuring the refrigerant saturation temperature and/or pressure of the refrigerant in the liquid cooling section; and responsive to one or both of the temperature of the supply liquid and the refrigerant saturation temperature and/or pressure, maintaining pressure of the refrigerant in the liquid cooling section above a threshold. Where the liquid cooling section is a water cooling section, the refrigerant pressure in the water cooling section is maintained above the freezing point of water.

providing the generated supply air and the generated supply liquid to devices, such as servers of a micro data center or in a server rack, having components cooled by the received supply liquid and components cooled by the received supply air. Again, the supply liquid can be used to cool central processing units (CPUs), graphic processing units, random access memory (RAM), random access memory dual inline memory modules (RAM DIMM), and voltage regulators while the supply air can be used to cool resistors, capacitors, wires, and solder traces. Liquid from the devices can be returned to the dual air and liquid evaporator via a return line and excess moisture can be removed by the air cooling section and contaminants can be removed from return liquid prior to be looped back to the dual air and liquid evaporator.

Figure 9:
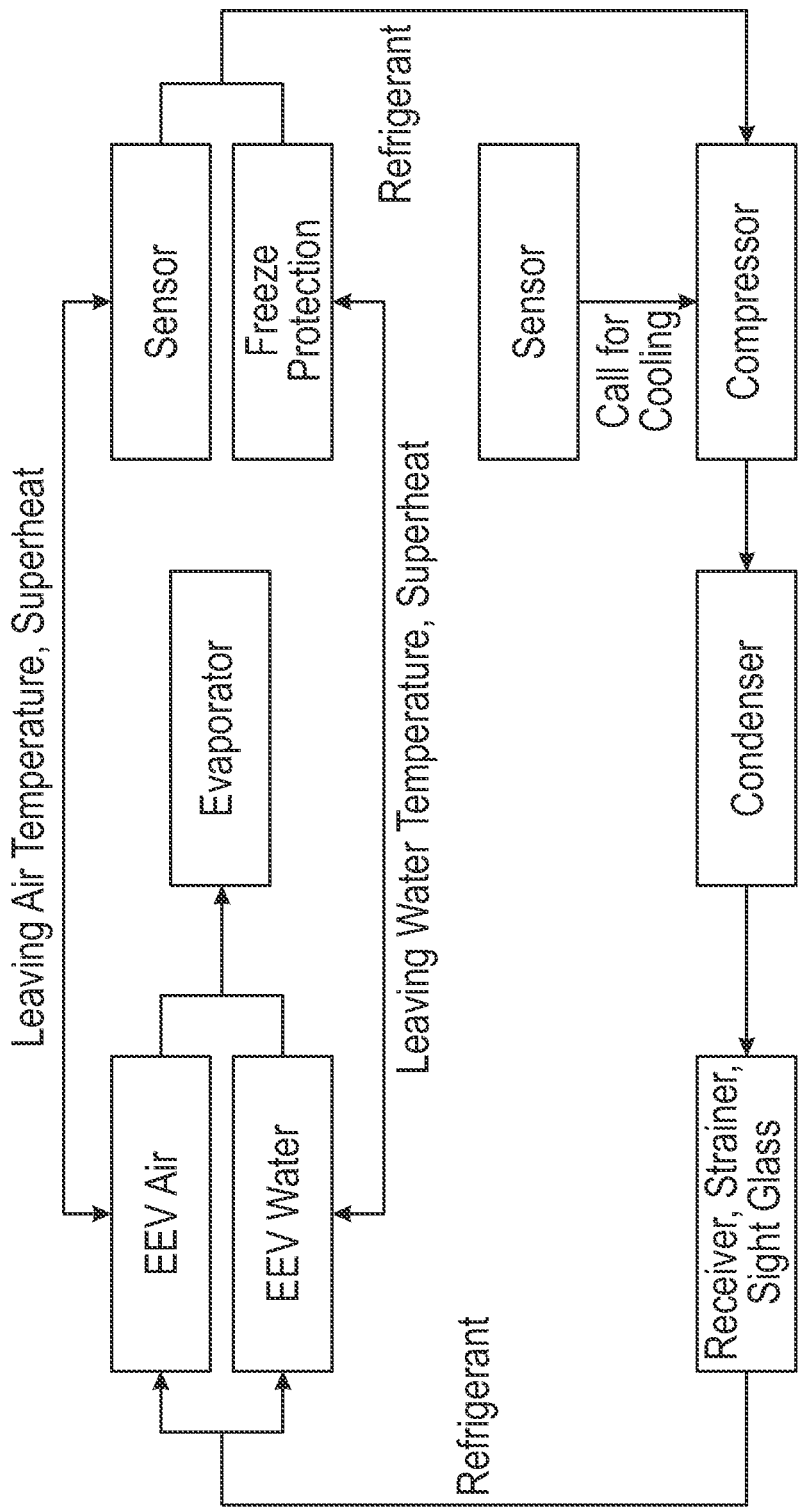
FIG. 9 is a block diagram that illustrates a process of dual air and water cooling within the system, in accordance with various embodiments.

More specifically, reference is made to the block diagram of FIG. 9 is which a process of dual air and water cooling within the system, in accordance with various representative embodiments, is shown. The following description uses the reference numbers of previous figures.

Refrigerant Circuits:
Call for Cooling

Air and water sensor outputs 15, 22, 28 are monitored by the programmable logic controller PLC 29. When the programmable temperature set point is reached for water and/or air the first compressor 1 is cycled on. The compressor begins the flow of the volatile refrigerant through the system. Any additional compressors 1 cycle on when the air or water temperatures reach set point plus the programmable offset temperature between compressor stages plus a programmable temperature dead band.

The deferential pressure created by the running compressor 1 forces liquid refrigerant in the liquid line to flow from the receiver 5 through the drier strainer 6 and the sight glass 7 where it is then made available to the air cooling and water cooling electronic expansion valves 8, 9. The valves throttle open on a signal from the PLC, the algorithm in the PLC that controls the valves is a series of proportional integral and derivative (PID) loops that control the following:

1. Leaving air temperature
2. Superheat in the refrigerant in the air cooling section of the coil
3. Leaving water temperature
4. Superheat in the refrigerant in the water cooling section of the coil The PLC 29 is programmed to ensure that super heat in either circuit does not drop below 5° F. (2.8° C.), for example. The flow is constantly throttled based on the changing air and water temperatures as well as the changes in superheat.

Refrigerant leaving the air cooling section electronic expansion valve 8 begins to change phase due to the pressure drop across the valve seat. A saturated vapor/liquid refrigerant mixture then enters the air cooling coil section where it continues to absorb heat energy from the air flowing over the coil. As the refrigerant absorbs this heat energy it continues to change phase converting from a saturated liquid/vapor mixture to a super-heated vapor.

Refrigerant leaving the water cooling section electronic expansion valve 9 begins to change phase due to the pressure drop across the valve seat. A saturated vapor/liquid refrigerant mixture then enters the water cooling coil section where it continues to absorb heat energy from the water flowing through the internal tube 32 and air flowing over the outer tube 31. As the refrigerant absorbs this heat energy it continues to change phase converting from a saturated liquid/vapor mixture to a super-heated vapor. In addition to the electronic evaporator expansion valve the electronic evaporator pressure regulator valve actuates as necessary to keep refrigerant temperature above freezing to ensure that the water flowing through the inner tube 32 does not freeze and damage the evaporator. The electronic evaporator pressure regulator is positioned by the PLC 29 based on inputs from the temperature and pressure sensors located in the refrigerant piping 26, 27.

The low pressure, low temperature refrigerant exiting the air and water cooling sections of the evaporator is sucked into the compressor 1 suction where it is converted to a high pressure high temperature gas. This gas then flows into the air, water, or glycol condenser where it rejects its heat to the air, water, or glycol so that that heat can be transferred to somewhere where it is not objectionable (outdoors typically).

By this process both air and water are cooled to set point.

If the heat load in the air or water decreases such that cooling is not necessary as indicated by the air or water sensors 15, 22, 28 the PLC 29 will begin cycling off the compressors 1 sequentially to match the current heat load.

Water Circuits:
Call for Cooling

The PLC sends an enable signal to the primary water pump 16 which starts the pump. After a programmable time delay the PLC 29 compares the input from temperature sensors 15, 22 to ensure that a temperature delta exists (verifying that there is water flow prior to energizing a compressor). The water flows to the heat load heat exchanger (typical heat load represented by 25). The heat energy is transferred into water from the heat source. The water then flows through a fine mesh strainer to ensure that no significant particulate that may be trapped in the water piping may enter the water cooling section of the evaporator. The strainer can be cleaned while the system is in operation. The heated water then enters the inner tubes 32 of the water cooling section 13 of the evaporator coil where it rejects the heat energy that it has absorbed into the refrigerant flowing though the outer tubes 31. The cooled water now flows into the suction of the pump and the cycle begins again.

Standby Pump:

If water temperatures sensors indicate that the water temperature is above set point but there is not the set point delta between the temperatures as indicated to the PLC 29 by sensors 15, 22 this will register as a primary pump failure and the standby pump will be activated and primary pump turned off.

Combined Air and Water Cooling:

Referring now to FIGS. 10-17, an alternate embodiment in which combined air and water cooling is used is illustrated. In these illustrations it can be seen that coaxial tubes cool both air and liquid in an air and water cooling section.

Figure 10:
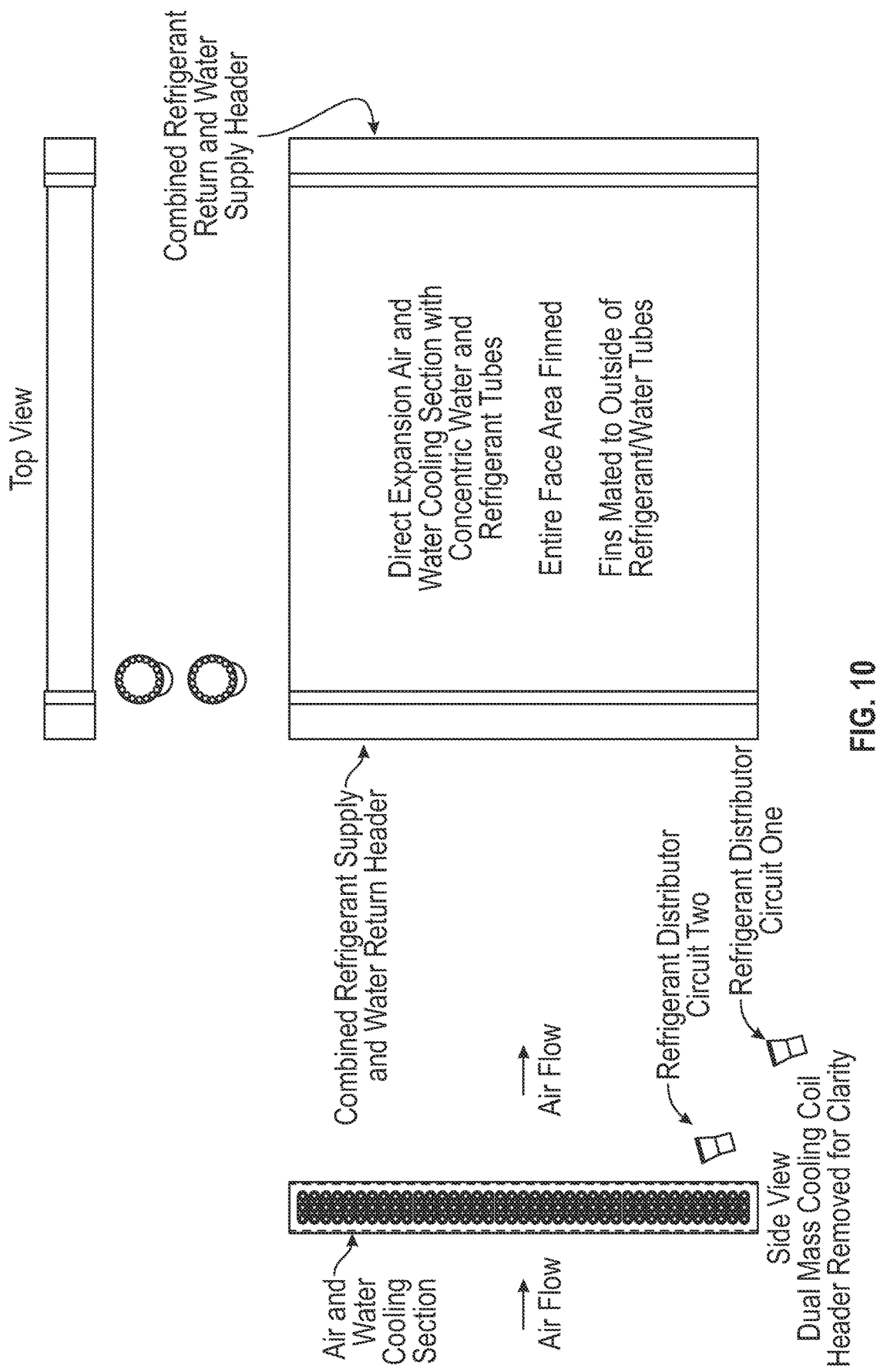
FIG. 10 illustrates example construction of a dual air and liquid evaporator, in accordance with various alternate embodiments.
Figure 11:
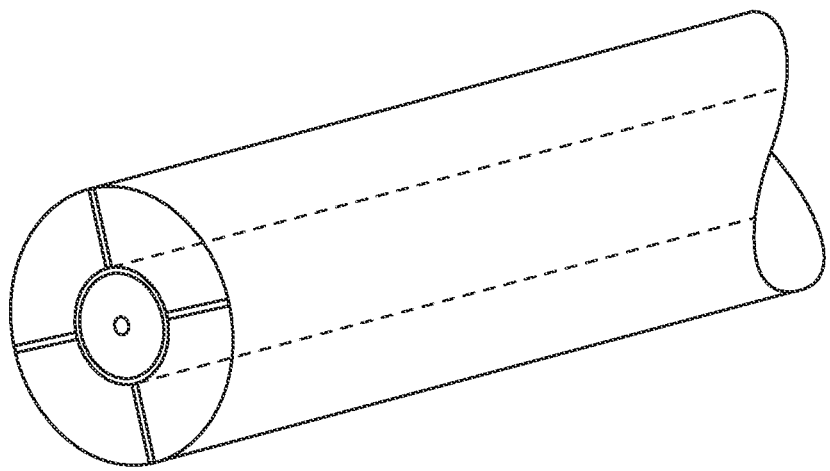
FIG. 11 illustrates a further embodiment of an example coaxial tube, in accordance with various alternate embodiments.

Referring now FIG. 10, a combined air and water cooling section 10 in accordance with the alternate embodiment is shown. FIG. 11 illustrates the relationship between a water tube and refrigerant tube. The water tube carrying process water flows through the central tube, while the outer tube carries the volatile refrigerant. Air flows over the outer refrigerant tube in such a way that the volatile refrigerant absorbs heat energy from both the process water and the process air.

Figure 12:
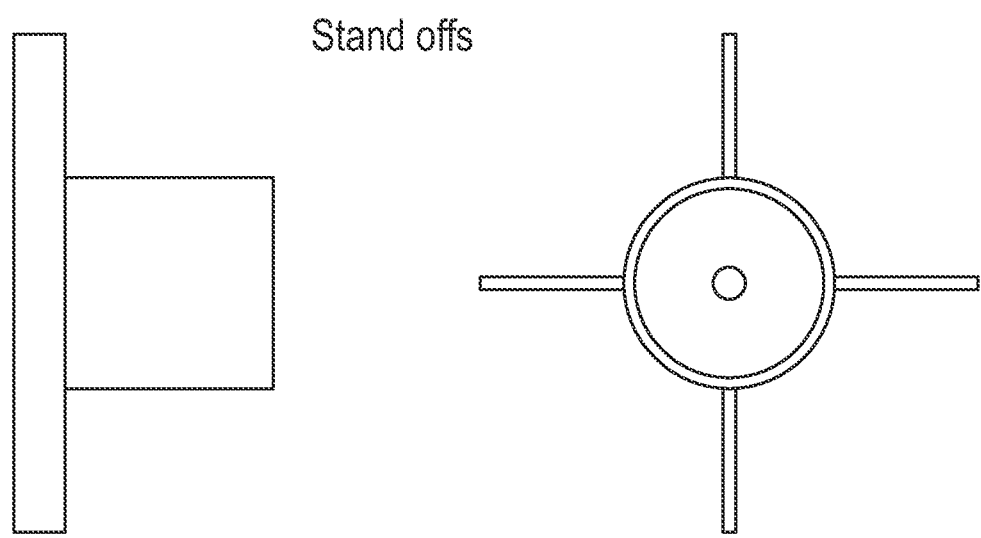
FIG. 12 illustrates the standoffs that position the inner water tube, in accordance with various alternate embodiments.

FIG. 12 illustrates the standoffs that position the inner water tube along the centerline of the outer refrigerant tube. The standoffs keep the two different tubes equal distance through the length of the evaporator heat exchanger. Only one standoff is shown for clarity, but multiple standoffs are brazed along the length of the inner tube before it is inserted into the outer tube. The standoffs are small in diameter to minimize pressure drop in the refrigerant system, and to allow the refrigerant to freely flow around the entire inner tube.

Figure 13:
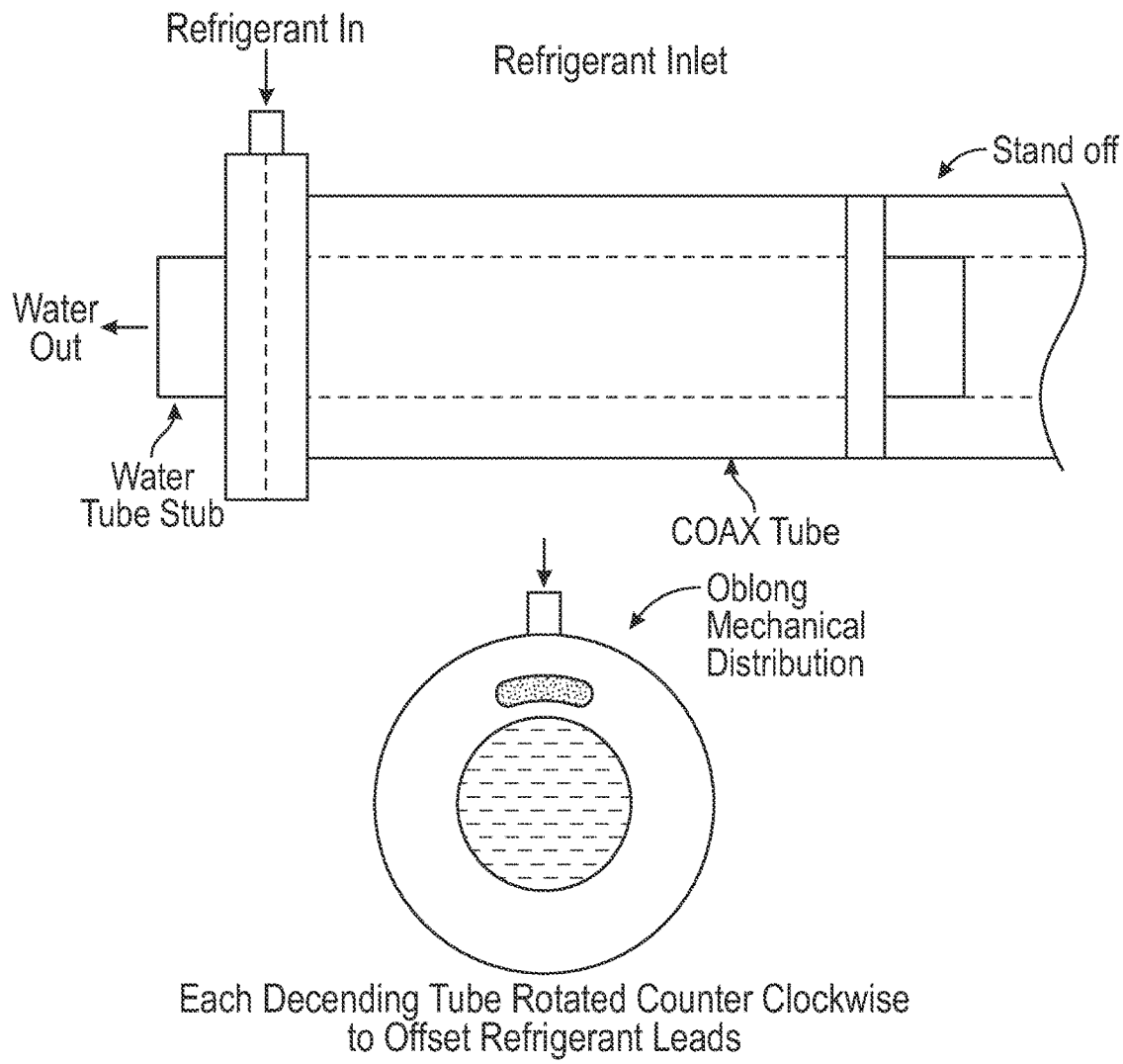
FIGS. 13 and 14 illustrate the process water and refrigerant flow through a system, in accordance with various alternate embodiments.
Figure 14:
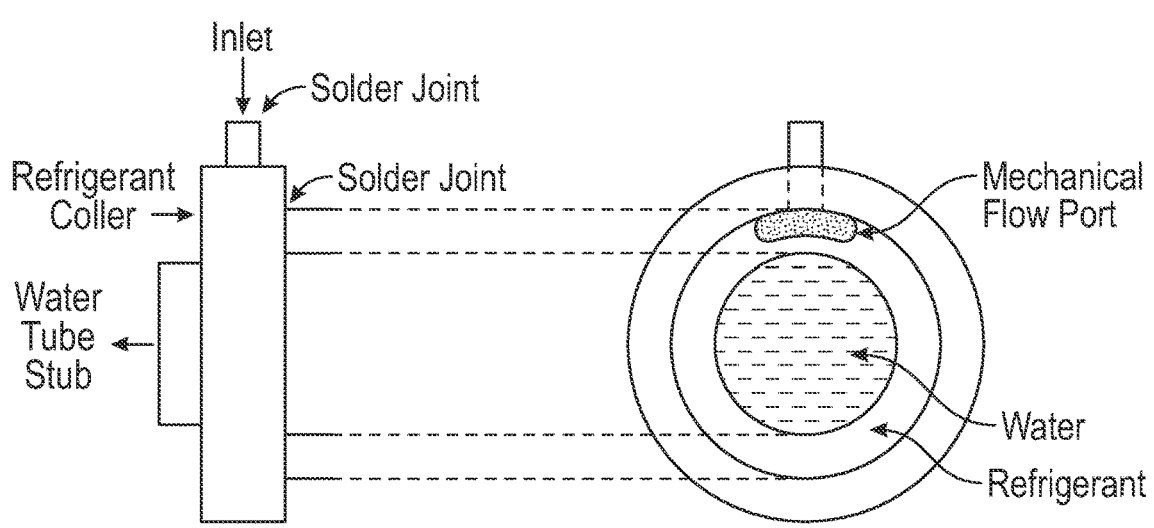

FIGS. 13 and 14 illustrate the process water and refrigerant flow through the system. Refrigerant from the thermal expansion valve or electronic expansion valve enters the refrigerant collar through a brazed-on stub tube. The stubs are rotated counterclockwise from that of the tube above it to allow clearance for the distributor tubes. This rotation may be approximately 70 and the distributor tubes may be copper, for example. The refrigerant flows into the outer refrigerant tube via the oblong mechanical distribution port, which is machined into the distribution ring. The refrigerant flows freely around the inner process water tube where it absorbs heat energy from both the process water flowing through the inner tube, and the process air flowing over the outer refrigerant tube. The refrigerant flashes to a vapor in the refrigerant tube by absorbing the equivalent latent heat of vaporization from both the process air and the process water. Additional heat absorbed by the refrigerant super heats that vapor ensuring no liquid refrigerant leaves the evaporator heat exchanger.

Figure 15:
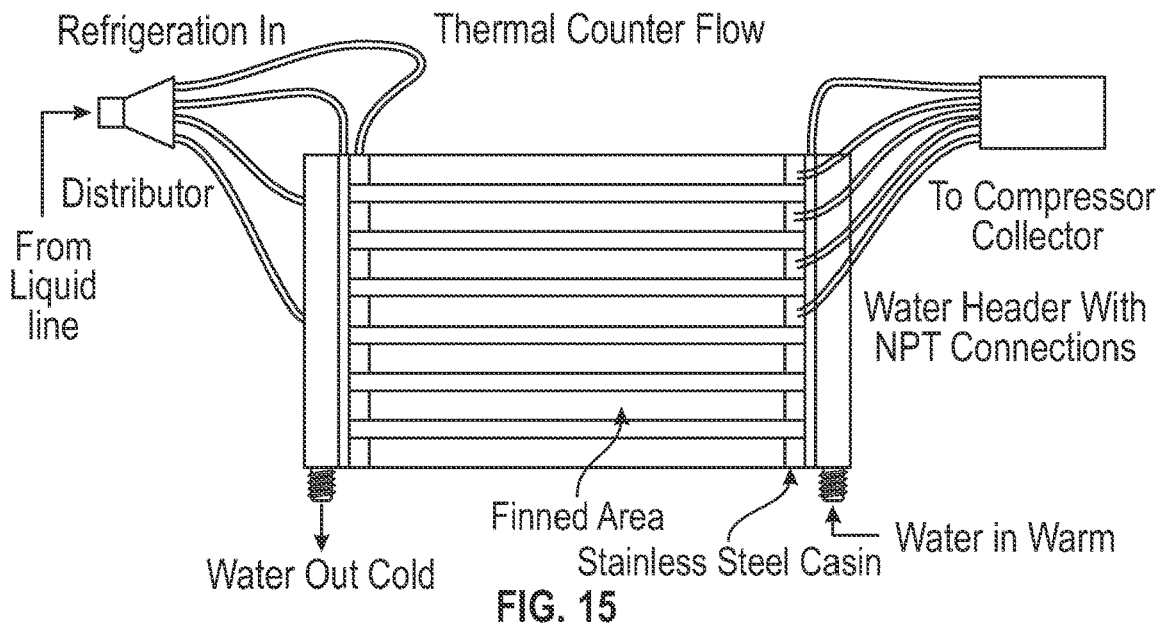
FIG. 15 illustrates thermal counter flow, in accordance with various alternate embodiments.

FIG. 15 illustrates how the evaporator is designed for thermal counter flow to ensure that there is a more even transfer of heat energy throughout the length of the tubes. This is accomplished by introducing the incoming refrigerant at a point in the evaporator heat exchanger where the warmest process water is present. By ensuring thermal counter flow (as opposed to thermal parallel flow) the efficiency of heat transfer along the length of the tubes is more consistently maintained.

Figure 16:
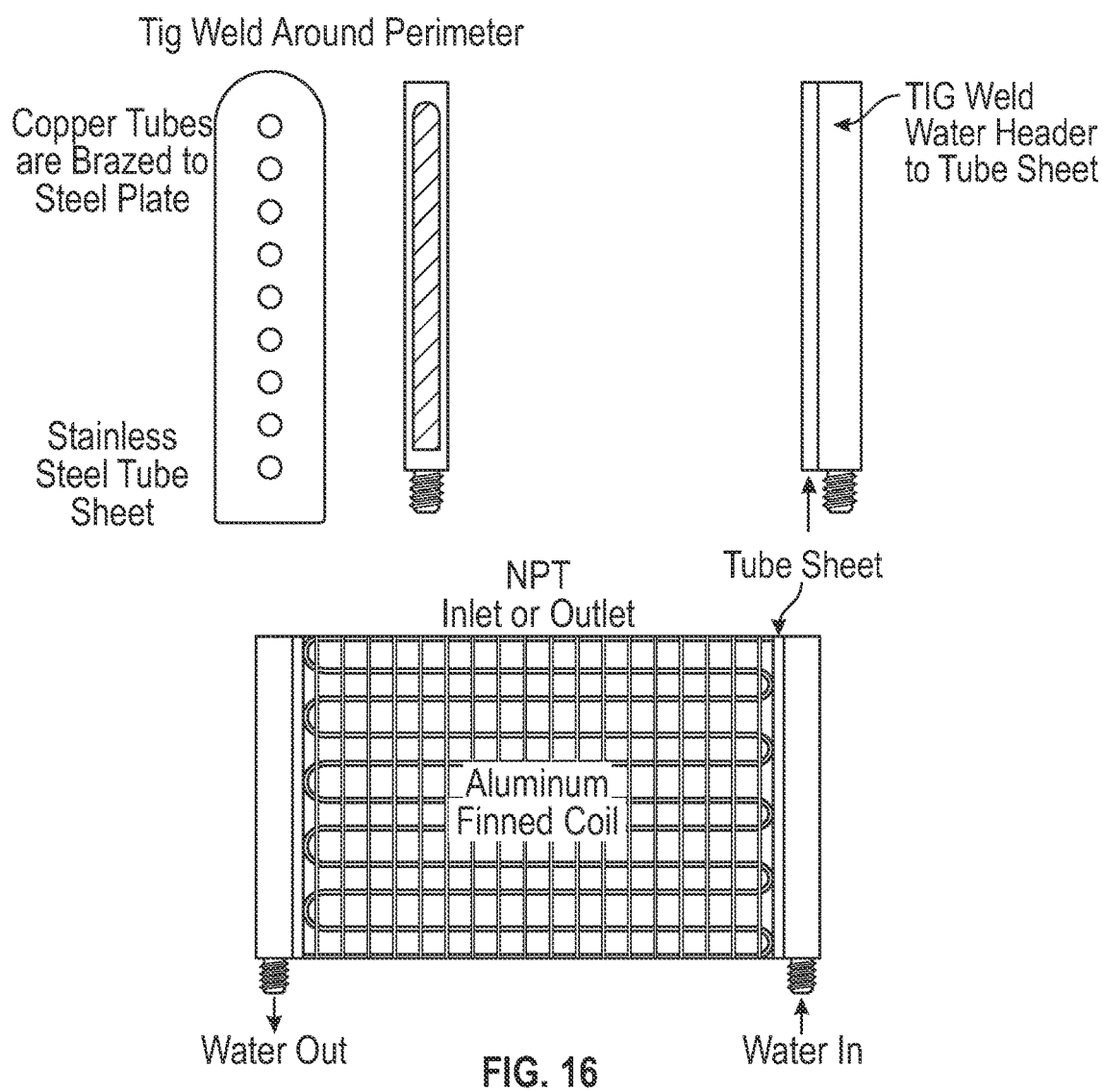
FIG. 16 illustrates the water header construction and the finned portion of the evaporator heat exchanger, in accordance with various alternate embodiments.

FIG. 16 details the water header construction and the finned portion of the evaporator heat exchanger. The water headers are machined or printed of metal and provide the flow path for the process water into and out of the evaporator heat exchanger. After all the refrigerant connections have been made, headers are welded (tungsten inert gas (TIG), for example) to the steel backing plate to which the individual refrigerant collars have been brazed. At the bottom of each header is a threaded connector to be connected to the process water supply and return.

The coaxial tubes have aluminum or copper fins pressed to the outside of the tube assembly, for example. These fins enhance heat transfer from the air passing over the coil to the refrigerant in the outer tube. Once the fins have been pressed, a tube sheet is brazed on to each end of the heat exchanger to ensure proper alignment and structural integrity of the evaporator heat exchanger.

Figure 17:
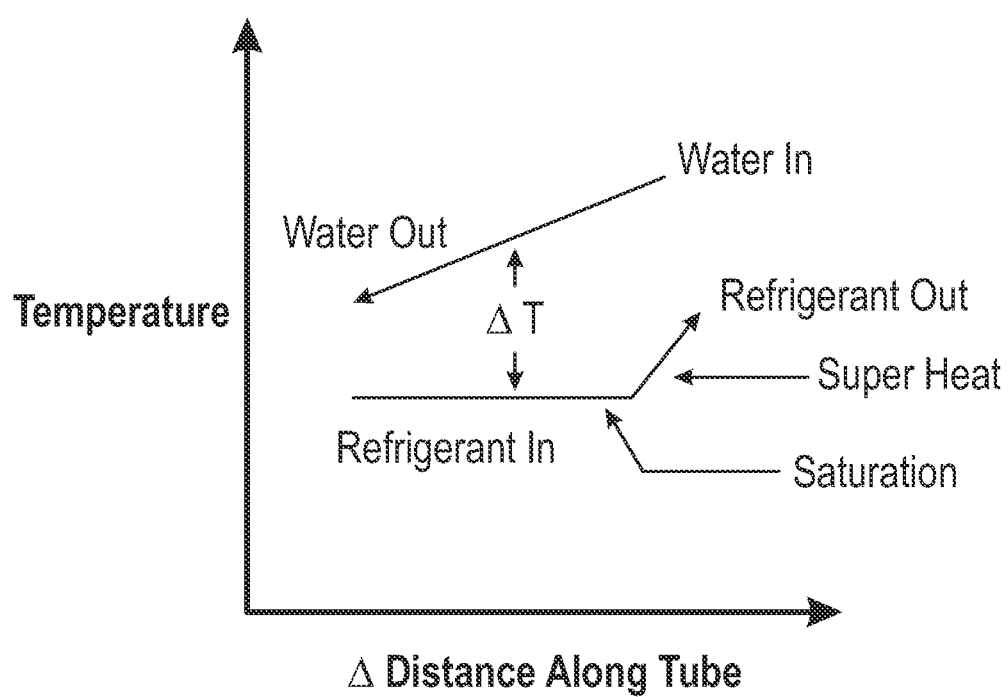
FIG. 17 illustrates temperature of process water and refrigerant as they move along a tube, in accordance with various alternate embodiments.

Referring now to FIG. 17, the temperatures of the process water and the refrigerant as the two substances move along the length of an individual tube in the evaporator heat exchanger are illustrated. The upper line represents the process water which enters the heat exchanger on the right side of the graph. It is important to note that when the water is at its highest temperature it first makes contact with the highest enthalpy level of the refrigerant, in this location that refrigerant in a super-heated vapor. To maintain thermal counter flow the warmest water must first encounter the highest energy (leaving) refrigerant. On the left side of the graph the entering refrigerant enters as a saturated gas liquid mixture (thus the flat nature of the process line). The refrigerant enters saturated due to the pressure drop across the expansion valve prior to entering the heat exchanger. The lowest energy refrigerant first encounters the heat transfer from the colder leaving water. This flow pattern keeps a more consistent temperature differential between the two substances to increase heat transfer efficiency.

The above systems, devices, methods, processes, and the like may be realized in hardware, software, or any combination of these suitable for a particular application. The hardware, including the PLC, may include a general-purpose computer and/or dedicated computing device. This includes realization in one or more microprocessors, microcontrollers, embedded microcontrollers, programmable digital signal processors or other programmable devices or processing circuitry, along with internal and/or external memory. This may also, or instead, include one or more application specific integrated circuits, programmable gate arrays, programmable array logic components, or any other device or devices that may be configured to process electronic signals. It will further be appreciated that a realization of the processes or devices described above may include computer-executable code created using a structured programming language such as C, an object oriented programming language such as C++, or any other high-level or low-level programming language (including assembly languages, hardware description languages, and database programming languages and technologies) that may be stored, compiled or interpreted to run on one of the above devices, as well as heterogeneous combinations of processors, processor architectures, or combinations of different hardware and software. In another aspect, the methods may be embodied in systems that perform the steps thereof, and may be distributed across devices in a number of ways. At the same time, processing may be distributed across devices such as the various systems described above, or all of the functionality may be integrated into a dedicated, standalone device or other hardware. In another aspect, means for performing the steps associated with the processes described above may include any of the hardware and/or software described above. All such permutations and combinations are intended to fall within the scope of the present disclosure.

Embodiments disclosed herein may include computer program products comprising computer-executable code or computer-usable code that, when executing on one or more computing devices, performs any and/or all of the steps thereof. The code may be stored in a non-transitory fashion in a computer memory, which may be a memory from which the program executes (such as random access memory associated with a processor), or a storage device such as a disk drive, flash memory or any other optical, electromagnetic, magnetic, infrared or other device or combination of devices. In another aspect, any of the systems and methods described above may be embodied in any suitable transmission or propagation medium carrying computer-executable code and/or any inputs or outputs from same.

It will be appreciated that the devices, systems, and methods described above are set forth by way of example and not of limitation. Absent an explicit indication to the contrary, the disclosed steps may be modified, supplemented, omitted, and/or re-ordered without departing from the scope of this disclosure. Numerous variations, additions, omissions, and other modifications will be apparent to one of ordinary skill in the art. In addition, the order or presentation of method steps in the description and drawings above is not intended to require this order of performing the recited steps unless a particular order is expressly required or otherwise clear from the context.

The method steps of the implementations described herein are intended to include any suitable method of causing such method steps to be performed, consistent with the patentability of the following claims, unless a different meaning is expressly provided or otherwise clear from the context. So, for example, performing the step of X includes any suitable method for causing another party such as a remote user, a remote processing resource (e.g., a server or cloud computer) or a machine to perform the step of X. Similarly, performing steps X, Y, and Z may include any method of directing or controlling any combination of such other individuals or resources to perform steps X, Y, and Z to obtain the benefit of such steps. Thus method steps of the implementations described herein are intended to include any suitable method of causing one or more other parties or entities to perform the steps, consistent with the patentability of the following claims, unless a different meaning is expressly provided or otherwise clear from the context. Such parties or entities need not be under the direction or control of any other party or entity, and need not be located within a particular jurisdiction.

It should further be appreciated that the methods above are provided by way of example. Absent an explicit indication to the contrary, the disclosed steps may be modified, supplemented, omitted, and/or re-ordered without departing from the scope of this disclosure.

It will be appreciated that the methods and systems described above are set forth by way of example and not of limitation. Numerous variations, additions, omissions, and other modifications will be apparent to one of ordinary skill in the art. In addition, the order or presentation of method steps in the description and drawings above is not intended to require this order of performing the recited steps unless a particular order is expressly required or otherwise clear from the context. Thus, while particular embodiments have been shown and described, it will be apparent to those skilled in the art that various changes and modifications in form and details may be made therein without departing from the scope of this disclosure and are intended to form a part of the disclosure as defined by the following claims, which are to be interpreted in the broadest sense allowable by law.

The various representative embodiments, which have been described in detail herein, have been presented by way of example and not by way of limitation. It will be understood by those skilled in the art that various changes may be made in the form and details of the described embodiments resulting in equivalent embodiments that remain within the scope of the appended claims.

What is claimed is:

1. A dual air and liquid evaporator, comprising:
   an air cooling section including an evaporator coil having a tube configured to receive refrigerant that changes phase to remove heat energy from an air flow; and
   a liquid cooling section, including an evaporator coil having an process tube and an outer tube, the inner tube configured to receive a liquid flow, the outer tube configured to receive refrigerant that changes phase to remove heat energy from the air flow and the liquid flow through one or more stub tubes coupled to the outer tube of the liquid cooling section and configured to be rotated to provide an offset from other tubes of the liquid cooling section,
   where the refrigerant provided to the air cooling section evaporator coil and the refrigerant provided to the liquid cooling section evaporator coil are separately controlled, and
   where the air cooling section evaporator coil and the liquid cooling section evaporator coil are housed in a common frame.

2. The evaporator of claim 1, where the pressure and temperature of the refrigerant provided to the air cooling section evaporator coil and the pressure and temperature of the refrigerant provided to the liquid cooling section evaporator coil are separately controlled.

3. The evaporator of claim 1, where the air cooling section evaporator coil tube is copper and includes aluminum or copper fins.

4. The evaporator of claim 1, where:
   the temperature of the refrigerant provided to the air cooling section evaporator coil is maintained below the temperature of the air flow surrounding the tube by a first control valve; and
   the temperature of the refrigerant provided to the liquid cooling section evaporator coil is maintained below the temperature of the air flow surrounding the outer tube and above a freezing temperature of the liquid flow within the inner tube by a second control valve.

5. The evaporator of claim 4, where:
   the first control valve is coupled to and in communication with the air cooling section evaporator coil tube, where the first control valve controls temperature of the refrigerant provided to the air cooling section evaporator coil; and
   the second control valve is coupled to and in communication with the liquid cooling section evaporator coil outer tube, where the second control valve controls temperature of the refrigerant provided to the liquid cooling section evaporator coil.

6. The evaporator of claim 5, where the first control valve and the second control valve are electronic expansion valves.

7. The evaporator of claim 1, where the air cooling section removes excess moisture from the air flow.

8. The evaporator of claim 1, where the one or more stub tubs coupled to the outer tube of the liquid cooling section are configured to be rotated counterclockwise to provide the offset.

9. The evaporator of claim 8, further comprising an oblong mechanical distributor port coupled to the outer tube of the liquid cooling section and configured to receive refrigerant into the outer tube.

10. A dual mass cooling system, comprising:
    a fan to configured to generate an air flow;
    a pump configured to generate a liquid flow; and
    a dual evaporator, including:
      a first section including an evaporator coil having a tube configured to receive a first refrigerant flow that absorbs heat from the air flow, and
      a second section including an evaporator coil having an inner tube and an outer tube, the inner tube configured to receive the liquid flow, the outer tube configured to receive a second refrigerant flow that absorbs heat from the air flow and the liquid flow through one or more stub tubes coupled to the outer tube of the second section and configured to be rotated to provide an offset from other tubes of the second section, where the first refrigerant flow and the second refrigerant flow are separately controlled.

11. The system of claim 10, where the dual evaporator includes a common frame configured to house the first section evaporator coil and the second section evaporator coil.

12. The system of claim 10, where the first refrigerant flow is controlled by a first control valve fluidically coupled to the first section evaporator coil tube.

13. The system of claim 12, where the first control valve maintains a temperature of the first refrigerant flow below a temperature of the air flow.

14. The system of claim 13, where the second refrigerant flow is controlled by a second control valve fluidically coupled to the second section evaporator coil outer tube.

15. The system of claim 14, where the second control valve maintains a temperature of the second refrigerant flow below a temperature of the air flow and above a freezing temperature of the liquid flow.

16. The system of claim 15, where the first control valve and the second control valve are electronic expansion valves.

17. The system of claim 16, further comprising a refrigerant loop including at least one compressor, a condenser, a receiver, the first control valve, the second control valve, and the dual evaporator.

18. The system of claim 17, further comprising:
an air flow temperature sensor configured to measure a temperature of the air flow;
a liquid flow temperature sensor configured to measure a temperature of the liquid flow; and
a controller configured to:
receive measured temperatures of the air flow and the liquid flow, and
in response, send control signals to the first control valve and the second control valve to maintain the temperatures of the first and second refrigerant flows.

19. The system of claim 18, where the controller is configured to send the control signals to the first and second control valves periodically.

20. The system of claim 10, where the first section evaporator coil includes fins attached to the tube.

21. The system of claim 20, where the second section evaporator coil includes fins attached to the outer tube.

22. The system of claim 21, where the first section evaporator coil tube and the second section evaporator coil inner and outer tubes are copper, and the first and second section evaporator coil fins are aluminum or copper.

23. The system of claim 10, where the one or more stub tubes coupled to the outer tube of the second section are configured to be rotated counterclockwise to provide the offset.

24. The system of claim 10, further comprising an oblong mechanical distributor port coupled to the outer tube of the second section and configured to receive refrigerant into the outer tube.

* * * * *